United States Patent
Hung et al.

(10) Patent No.: US 8,962,490 B1
(45) Date of Patent: Feb. 24, 2015

(54) METHOD FOR FABRICATING SEMICONDUCTOR DEVICE

(71) Applicant: United Microelectronics Corp., Hsin-Chu (TW)

(72) Inventors: Ching-Wen Hung, Tainan (TW); Jia-Rong Wu, Kaohsiung (TW); Chih-Sen Huang, Tainan (TW); Chieh-Te Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 9 days.

(21) Appl. No.: 14/048,043

(22) Filed: Oct. 8, 2013

(51) Int. Cl.
*H01L 21/302* (2006.01)
*H01L 21/461* (2006.01)
*H01L 21/768* (2006.01)
*H01L 29/66* (2006.01)

(52) U.S. Cl.
CPC .... *H01L 21/76814* (2013.01); *H01L 29/66477* (2013.01)
USPC ............ 438/734; 438/620; 438/637; 438/689

(58) Field of Classification Search
CPC .................. H01L 21/76802; H01L 27/10855; H01L 29/41766; H01L 29/66545; H01L 21/02063; H01L 21/76814; H01L 21/823475
USPC .................................. 438/620, 637, 689, 734
See application file for complete search history.

(56) References Cited

U.S. PATENT DOCUMENTS

| | | | |
|---|---|---|---|
| 5,314,845 A | 5/1994 | Lee | |
| 5,362,526 A | 11/1994 | Wang | |
| 5,387,546 A | 2/1995 | Maeda | |
| 5,998,873 A | 12/1999 | Blair | |
| 6,015,759 A | 1/2000 | Khan | |
| 6,037,237 A | 3/2000 | Park | |
| 6,074,946 A | 6/2000 | Ouellet | |
| 6,103,601 A | 8/2000 | Lee | |
| 6,153,530 A | 11/2000 | Ye | |
| 6,162,587 A | 12/2000 | Yang | |
| 6,380,096 B2 | 4/2002 | Hung | |
| 6,426,285 B1 | 7/2002 | Chen | |
| 6,465,352 B1 | 10/2002 | Aoki | |
| 6,573,176 B2 | 6/2003 | Hong | |
| 6,605,545 B2 | 8/2003 | Wang | |
| 6,638,871 B2 | 10/2003 | Wang | |

(Continued)

OTHER PUBLICATIONS

Hung, Title of Invention: Method of Forming Semiconductor Structure Having Contact Plug, U.S. Appl. No. 13/740,289, filed Jan. 14, 2013.

*Primary Examiner* — Bac Au
(74) *Attorney, Agent, or Firm* — Winston Hsu; Scott Margo

(57) ABSTRACT

A method for fabricating semiconductor device is disclosed. The method includes the steps of: providing a substrate having an interlayer dielectric (ILD) layer thereon, wherein at least one metal gate is formed in the ILD layer and at least one source/drain region is adjacent to two sides of the metal gate; forming a first dielectric layer on the ILD layer; forming a second dielectric layer on the first dielectric layer; performing a first etching process to partially remove the second dielectric layer; utilizing a first cleaning agent for performing a first wet clean process; performing a second etching process to partially remove the first dielectric layer; and utilizing a second cleaning agent for performing a second wet clean process, wherein the first cleaning agent is different from the second cleaning agent.

10 Claims, 2 Drawing Sheets

(56) References Cited

U.S. PATENT DOCUMENTS

| | | |
|---|---|---|
| 6,649,531 B2 | 11/2003 | Cote |
| 6,696,222 B2 | 2/2004 | Hsue |
| 6,720,132 B2 | 4/2004 | Tsai |
| 6,797,627 B1 | 9/2004 | Shih |
| 6,812,145 B2 | 11/2004 | Ma |
| 6,905,968 B2 | 6/2005 | Hsieh |
| 6,924,228 B2 | 8/2005 | Kim |
| 6,930,048 B1 | 8/2005 | Li |
| 7,067,235 B2 | 6/2006 | Tsai |
| 7,176,126 B2 | 2/2007 | Oh |
| 7,214,620 B2 | 5/2007 | Kim |
| 7,544,623 B2 | 6/2009 | Chou |
| 8,399,360 B1 | 3/2013 | Miller |
| 2003/0129844 A1 | 7/2003 | Wang |
| 2006/0024951 A1 | 2/2006 | Schuehrer |
| 2006/0042651 A1 | 3/2006 | Verhaverbeke |
| 2006/0148243 A1 | 7/2006 | Wang |
| 2006/0252256 A1* | 11/2006 | Weng et al. ............... 438/637 |
| 2006/0286793 A1 | 12/2006 | Lin |
| 2007/0020565 A1 | 1/2007 | Koh |
| 2007/0052107 A1 | 3/2007 | Weng |
| 2007/0054491 A1* | 3/2007 | Chen ......................... 438/689 |
| 2007/0066047 A1* | 3/2007 | Ye et al. ..................... 438/620 |
| 2007/0077751 A1 | 4/2007 | Chen |
| 2007/0080386 A1 | 4/2007 | Huang |
| 2007/0093053 A1 | 4/2007 | Hsu |
| 2007/0111514 A1 | 5/2007 | Chen |
| 2007/0184996 A1 | 8/2007 | Weng |
| 2007/0190805 A1 | 8/2007 | Lin |
| 2007/0249165 A1 | 10/2007 | Huang |
| 2008/0121619 A1 | 5/2008 | Lin |
| 2008/0124919 A1 | 5/2008 | Huang |
| 2008/0146036 A1 | 6/2008 | Lai |
| 2008/0171433 A1 | 7/2008 | Huang |
| 2008/0206991 A1* | 8/2008 | Rahhal-Orabi ............ 438/689 |
| 2008/0292798 A1 | 11/2008 | Huh |
| 2009/0042053 A1 | 2/2009 | Lin |
| 2009/0142931 A1* | 6/2009 | Wang et al. ................ 438/734 |
| 2009/0176378 A1 | 7/2009 | Wang |
| 2009/0233827 A1 | 9/2009 | Egbe et al. |
| 2009/0283310 A1 | 11/2009 | Chen |
| 2009/0283921 A1 | 11/2009 | Wang |
| 2009/0314743 A1 | 12/2009 | Ma |
| 2010/0040768 A1 | 2/2010 | Dhindsa |
| 2010/0040982 A1 | 2/2010 | Liu |
| 2010/0105205 A1 | 4/2010 | Lee |
| 2013/0241004 A1* | 9/2013 | Yin et al. ................... 257/392 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more particularly to a method of using two different cleaning agents to perform two separate wet clean processes on the dielectric layers above metal gate.

2. Description of the Prior Art

Along with the continuous miniaturization of the Integrated Circuits (IC), the line width of interconnections and the feature size of semiconductor devices have continuously shrunk. In general, discrete devices in integrated circuits are connected to each other through contact plugs (or contact slots) and interconnection structures, and their related fabrication methods have become an important matter in the next-generation semiconductor devices.

In current fabricating processes, due to the limitations of the back end of the line (BEOL) process capacity, the yield of contact plugs with high aspect ratio (HAR) is relatively low and cannot reach the new requirements. In order to overcome this drawback, a contact can be divided into two parts, a lower contact structure and an upper contact structure (i.e. the metal level zero, M0). After the lower contact structure is formed completely, the M0 is formed thereafter. The M0 can be a pole structure or a slot structure. However, as the upper contact structure (M0) and the lower contact structure are formed in different steps, a barrier layer is typically formed between the upper contact structure (M0) and the lower contact structure thereby affecting the conductivity of the contact and increasing the complexity of the entire fabrication process.

In order to overcome the aforementioned drawbacks, there is a need to provide a modified method for fabricating interconnection structures with better yields.

SUMMARY OF THE INVENTION

A method for fabricating semiconductor device is disclosed. The method includes the steps of: providing a substrate having an interlayer dielectric (ILD) layer thereon, wherein at least one metal gate is formed in the ILD layer and at least one source/drain region is adjacent to two sides of the metal gate; forming a first dielectric layer on the ILD layer; forming a second dielectric layer on the first dielectric layer; performing a first etching process to partially remove the second dielectric layer; utilizing a first cleaning agent for performing a first wet clean process; performing a second etching process to partially remove the first dielectric layer; and utilizing a second cleaning agent for performing a second wet clean process, wherein the first cleaning agent is different from the second cleaning agent.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
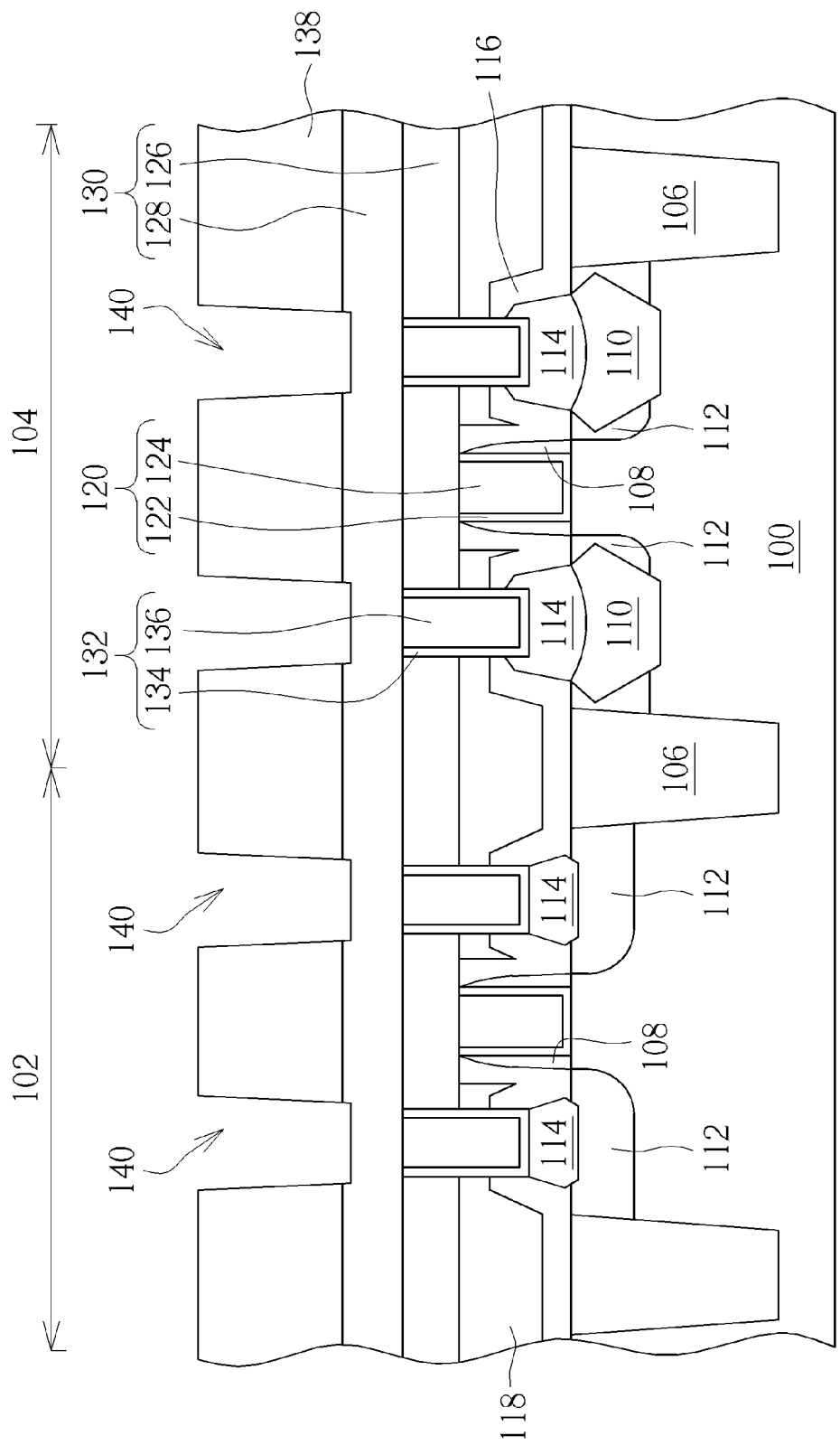
FIGS. 1-2 are schematic diagrams illustrating a method for fabricating semiconductor device according to a preferred embodiment of the present invention.
Figure 2:
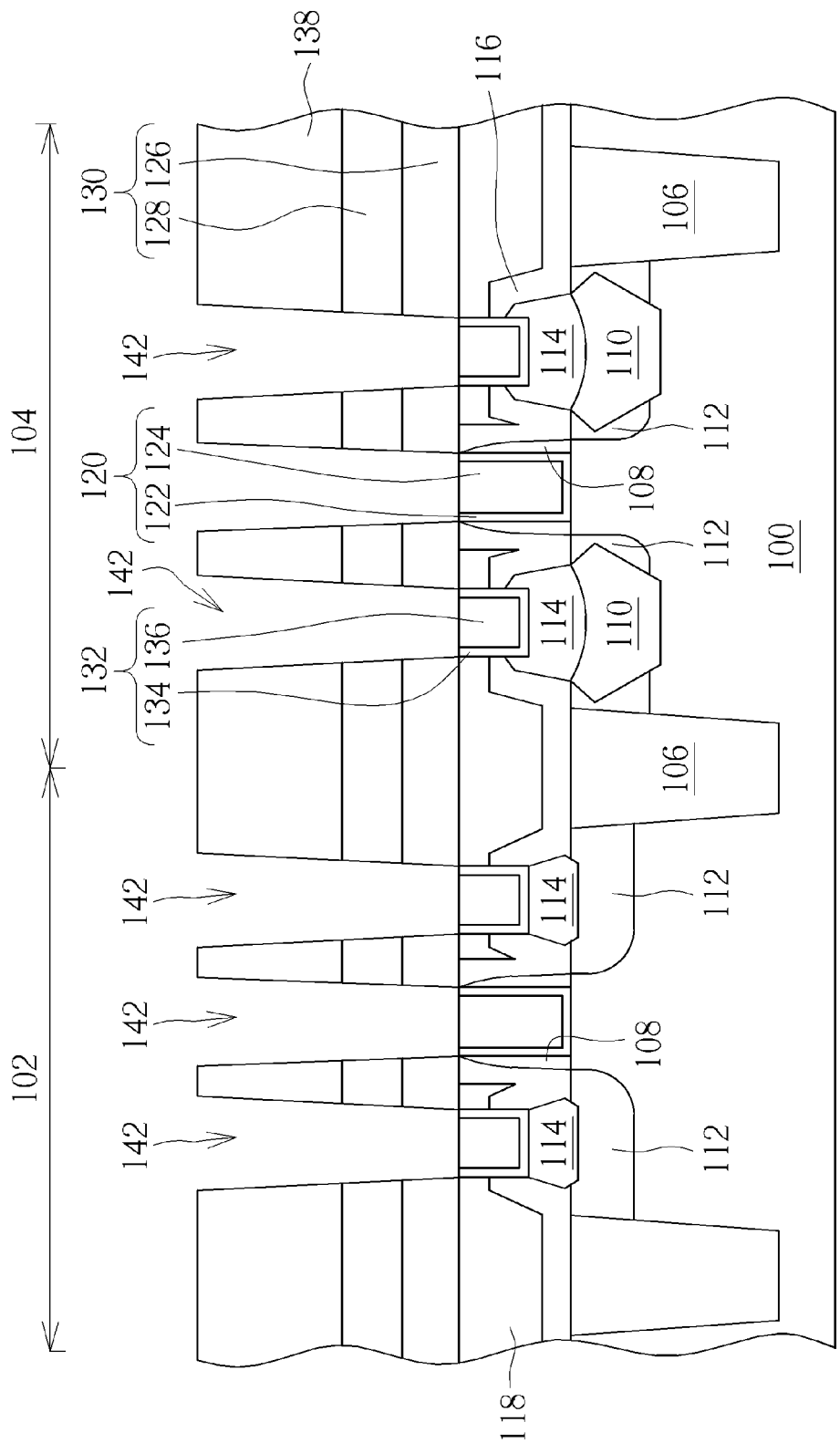

Referring to FIGS. 1-2, FIGS. 1-2 are schematic diagrams illustrating a method for fabricating semiconductor device according to a preferred embodiment of the present invention. As shown in FIG. 1, a substrate 100, such as a silicon substrate or a silicon-on-insulator (SOI) substrate is provided. A first region and a second region are defined on the substrate 100, such as a NMOS region 102 and a PMOS region 104. A plurality of shallow trench isolations (STI) 106 is formed in the substrate 100 for separating the two transistor regions. It should be noted that even though a high-k last process is utilized in this embodiment, a high-k first process could also be employed according to the demand of the product.

A plurality of dummy gates (not shown) are then formed on the NMOS region 102 and the PMOS region 104 respectively, in which the dummy gates are preferably composed of silicon including undoped polysilicon, polysilicon having n+ dopants, or amorphous material. Preferably, during the formation of the dummy gates, a hard mask is typically formed on the silicon material of each dummy gate, however for the sake of brevity, the hard mask is omitted in the figures.

It should be noted that even though the dummy gates are fabricated on the substrate 100 directly, the present invention could also be applied to non-planar transistor technology such as a fin field effect transistor (FinFET) technology, and in such instance, fin-shaped structures will be first formed on the substrate and dummy gates will be formed on the fin-shaped structures thereafter. As the process for fabricating fin-shaped structures is well known to those skilled in the art, the details of which is not explained herein for sake of brevity.

Next, ion implantations are carried out in the NMOS region 102 and the PMOS region 104 to form a lightly doped drain (not shown) in the substrate 100 adjacent to two sides of the dummy gates, and a spacer 108 is formed on the sidewall of the dummy gates thereafter, in which the spacer 108 may include an offset spacer and a main spacer. After the spacer is formed on the sidewall of each dummy gate, an epitaxial layer 110 and a source/drain region 112 are formed in the substrate 100 adjacent to two sides of the spacer 108 of the PMOS region 104, in which the epitaxial layer 110 preferably includes silicon germanium. It should be noted that the order for forming the epitaxial layer 110 and the source/drain region 112 is not limited to the one disclosed herein, and as such process is well known to those skilled in the art, the details of which are omitted herein for the sake of brevity.

A salicide process is performed thereafter by first forming a metal selected from a group consisting of cobalt, titanium, nickel, platinum, palladium, and molybdenum on the epitaxial layer 110 and the source/drain 112, and then using at least one rapid thermal anneal process to react the metal with epitaxial layer 110 and the source/drain 112 for forming a silicide layer 114 on the surface of the epitaxial layer 110 and the source/drain 112 of the NMOS region 102 and PMOS region 104. The un-reacted metal is removed thereafter.

Next, a contact etch stop layer (CESL) 116 is deposited on the dummy gates of both NMOS and PMOS regions, and a process such as flowable chemical vapor deposition (FCVD), is carried out to form an interlayer dielectric (ILD) layer 118 on the CESL 116.

A planarizing process, such as a chemical mechanical polishing (CMP) process is performed thereafter to partially remove the ILD layer 118, CESL 116, and hard mask (not shown) so that the top of the dummy gates composed of silicon is exposed and substantially even with the surface of the ILD layer 118.

Next, a replacement metal gate (RMG) process is conducted to form a metal gate 120 in each of the NMOS region 102 and PMOS region 104. According to a preferred embodiment of the present invention, the RMG process could be carried out by first performing a selective dry etching or wet etching process, such as using etchants including ammonium hydroxide ($NH_4OH$) or tetramethylammonium hydroxide (TMAH) to remove the silicon layer from the dummy gates without etching the ILD layer 118 for forming a recess (not shown) in each transistor region 102 and 104.

Next, a high-k dielectric layer 122 is deposited via an atomic layer deposition (ALD) process or a metal-organic chemical vapor deposition (MOCVD) process into the recess and on the surface of the ILD layer 118. According to a preferred embodiment of the present invention, the RMG process includes approaches such as gate first process, high-k first process from gate last process, high-k last process from gate last process, or silicon gate process. The present embodiment is preferably accomplished by employing the high-k last process from the gate last process, hence the high-k dielectric layer 122 preferably has a "U-shaped" cross section. The high-k dielectric layer 122 could be made of dielectric materials having a dielectric constant (k value) larger than 4, in which the material of the high-k dielectric layer 122 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or combination thereof.

At least a barrier layer (not shown) and a work function layer (not shown) and a low resistance metal layer 124 are then deposited to fill the recess, in which the barrier layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto and the work function layer may be a n-type work function layer or a p-type work function layer depending on the type of device being fabricated.

Preferably, the n-type work function layer has a work function ranging between 3.9 eV and 4.3 eV and may be selected from a group consisting of titanium aluminide (TiAl), zirconium aluminide (ZrAl), tungsten aluminide (WAl), tantalum aluminide (TaAl), and hafnium aluminide (HfAl), but not limited thereto.

The p-type work function layer has a work function ranging between 4.8 eV and 5.2 eV and may be selected from a group consisting of titanium nitride (TiN), tantalum nitride (TaN), and tantalum carbide (TaC), but not limited thereto.

Preferably, the low resistance metal layer 124 is selected from a group consisting of Al, Ti, Ta, W, Nb, Mo, Cu, TiN, TiC, TaN, Ti/W, TiAl, CoWP, and composite metal such as Ti/TiN, but not limited thereto. After the low resistance metal layer 124 is deposited, a planarizing process, such as a CMP process could be carried out to planarize the low resistance metal layer 124, the work function layers, and the high-k dielectric layer 122 for forming a metal gate 120 in each of the NMOS region 102 and PMOS region 104.

After the RMG process is completed, a first dielectric layer 130 is formed on the ILD layer 118 and the metal gates 120. According to a preferred embodiment of the present invention, the first dielectric layer 130 is a composite layer composed of a cap oxide layer 126 and a nitrogen doped carbide (NDC) layer 128.

Preferably, after depositing the cap oxide layer 126 and before the formation of the NDC layer 128, contact plugs 132 are formed in the cap oxide layer 126, ILD layer 118 and the CESL 116 to connect to the source/drain regions 112 in each region. The formation of the contact plugs is preferably accomplished by first conducting a photo-etching process to form a plurality of contact holes (not shown) in the cap oxide layer 126, the ILD layer 118, and the CESL 116 to expose the silicide layers 114, and then depositing a barrier/adhesive layer 134, a selective seed layer (not shown), and a conductive layer 136 into the contact holes, in which the barrier/adhesive layer 134 are formed conformally along the surfaces of the contact holes and the conductive layer 136 is deposited to completely fill the contact holes.

The barrier/adhesive layer 134 may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer 136 may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and more preferably tungsten, which can form suitable Ohmic contact between the conductive layer 136 and the metal silicide layer 114 or between the conductive layer 136 and the source/drain regions 112 underneath.

Then, a planarization step, such as a CMP process, an etching back process, or combination thereof can be performed to remove the barrier/adhesive layer 135, the seed layer and the conductive layer 136 outside the contact holes so that a top surface of a remaining conductive layer 136 and the top surface of the cap oxide layer 126 are coplanar, thereby forming a plurality of contact plugs 132 as lower contact structures.

After the contact plugs 132 are formed, the NDC layer 128 is deposited on the surface of the contact plugs 132 and the cap oxide layer 126, and a second dielectric layer 138 is formed on the NDC layer 128 thereafter. In this embodiment, the second dielectric layer 138 is preferably a Tetraethylorthosilicate (TEOS) layer, but not limited thereto.

Next, a M0CT process is carried out by performing a first etching process to partially remove the TEOS layer 138 for forming a plurality of first contact holes 140, in which the first contact holes 140 are further processed to form metal plugs electrically connected to the source/drain region 112. If viewed from a horizontal perspective as shown in FIG. 1, the first etching process preferably removes part of the TEOS layer 138 to form a plurality of first contact holes 140 directly above the source/drain region 112 in the TEOS layer 138.

After the first etching process is completed, a first cleaning agent is utilized to perform a first wet clean process for removing unwanted particles or residues. According to a preferred embodiment of the present invention, the first cleaning agent comprises Tetrakis(ethylmethylamino)hafnium (TEMAH) and $H_2O_2$, but not limited thereto.

Next, as shown in FIG. 2, a M0PY process is carried out by performing a second etching process to partially remove the TEOS layer 138, the NDC layer 128, and the cap oxide layer 126 underneath to form a plurality of second contact holes 142 in the TEOS layer 138, the NDC layer 128, and the cap oxide layer 126. The second contact holes 142 are further processed to form metal plugs electrically connected to the metal gate and the lower contact structures underneath.

If viewed from a horizontal perspective as revealed in FIG. 2, the second etching process preferably partially removes the TEOS layer 138 above the metal gates 120, partially removes the NDC layer 128 above the metal gates 120 and the source/drain regions 112, and then partially removes the cap oxide layer 126 above the metal gates 120 and the contact plugs 132 in the cap oxide layer 126 for forming the second contact holes 142.

After the second contact holes 142 are formed, a second cleaning agent is utilized to carry out a second wet clean process. Preferably, the second cleaning agent used in this stage is different from the first cleaning agent, in which the second cleaning agent preferably comprises deionized water (DI water). According to a preferred embodiment of the present invention, the second wet clean process is accomplished by using a combination of water and carbon dioxide gas ($CO_2$) at low speed for one minute and/or high speed for one minute. After the second wet clean process is completed, another contact formation process could be carried out to form contact plugs (not shown) in the second contact holes 142 for connecting to the lower contact structures 132. This completes the fabrication of a semiconductor device according to a preferred embodiment of the present invention.

Overall, the present invention utilizes two different cleaning agents in the two separate wet clean processes performed after the two etching processes conducted for forming contact holes in M0CT and M0PY. In contrast to the conventional approach of using TEMAH and $H_2O_2$ for both wet clean stages, the present invention preferably uses a first cleaning agent selected from a material consisting of TEMAH and $H_2O_2$ for the first wet clean process and then uses a second cleaning agent consisting of deionized water for the second wet clean process. By using such combinations in different stages of the wet clean processes, the drawback of using cleaning agent consisting of only TEMAH and $H_2O_2$ to clean contact holes after each etching stage as in the conventional approach thereby causing issues such as tungsten loss could be prevented. In addition to improvement in tungsten loess, the M0CT interface Rc could be improved substantially and overall fabrication cost could also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having an interlayer dielectric (ILD) layer thereon, wherein at least one metal gate is formed in the ILD layer and at least one source/drain region is adjacent to two sides of the metal gate;
    forming a first dielectric layer on the ILD layer;
    forming a second dielectric layer on the first dielectric layer;
    performing a first etching process to partially remove the second dielectric layer;
    utilizing a first cleaning agent for performing a first wet clean process;
    performing a second etching process to partially remove the first dielectric layer; and
    utilizing a second cleaning agent for performing a second wet clean process, wherein the first cleaning agent is different from the second cleaning agent.

2. The method of claim 1, wherein the first dielectric layer comprises a cap oxide layer and a nitrogen doped carbide (NDC) layer.

3. The method of claim 2, further comprising forming a plurality of first contact plugs in the ILD layer and the cap oxide layer above the source/drain region before forming the NDC layer.

4. The method of claim 3, wherein the second dielectric layer comprises a Tetraethylorthosilicate (TEOS) layer.

5. The method of claim 4, further comprising performing the first etching process to partially remove the TEOS layer above the source/drain region for forming a plurality of first contact holes in the TEOS layer.

6. The method of claim 4, further comprising performing the second etching process to partially remove the TEOS layer, the NDC layer and the cap oxide layer for forming a plurality of second contact holes in the TEOS layer, the NDC layer, and the cap oxide layer.

7. The method of claim 6, wherein the second etching process further comprises:
    partially removing the TEOS layer above the metal gate;
    partially removing the NDC layer above the metal gate and the source/drain region; and
    partially removing the cap oxide layer above the metal gate and the first contact plugs in the cap oxide layer for forming the second contact holes.

8. The method of claim 6, further comprising forming a plurality of second contact plugs in the second contact holes.

9. The method of claim 1, wherein the first cleaning agent comprises Tetrakis(ethylmethylamino)hafnium (TEMAH) and $H_2O_2$.

10. The method of claim 1, wherein the second cleaning agent comprises deionized water (DI water).

* * * * *